United States Patent
Nagai et al.

(10) Patent No.: US 9,515,653 B1
(45) Date of Patent: Dec. 6, 2016

(54) SIGNAL GENERATING CIRCUIT

(71) Applicant: Panasonic Intellectual Property Management Co., Ltd., Osaka (JP)

(72) Inventors: Shuichi Nagai, Osaka (JP); Miori Hiraiwa, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 15/160,600

(22) Filed: May 20, 2016

(30) Foreign Application Priority Data

Jun. 2, 2015 (JP) ................................. 2015-111879

(51) Int. Cl.
*G06G 7/12* (2006.01)
*H03K 17/693* (2006.01)

(52) U.S. Cl.
CPC .................. *H03K 17/693* (2013.01)

(58) Field of Classification Search
CPC ... H03K 17/691; H03K 17/16; H03K 17/6877
USPC ................ 327/108–112, 427, 434, 437, 436, 382,327/355; 326/82, 83, 87
See application file for complete search history.

(56) References Cited

U.S. PATENT DOCUMENTS

| 2014/0049297 | A1 | 2/2014 | Nagai et al. | |
| 2015/0222263 | A1* | 8/2015 | Nagai | H03K 17/163 327/382 |
| 2015/0222264 | A1* | 8/2015 | Nagai | H02M 1/08 327/382 |
| 2016/0197583 | A1* | 7/2016 | Lin | H03D 7/1441 327/355 |

FOREIGN PATENT DOCUMENTS

WO     2013/065254     5/2013

* cited by examiner

*Primary Examiner* — Lincoln Donovan
*Assistant Examiner* — Thomas Skibinski
(74) *Attorney, Agent, or Firm* — McDermott Will & Emery LLP

(57) ABSTRACT

In a signal generating circuit, a power supply terminal is connected with first terminals of a first switching element, a second switching element, and a third switching element; second terminals of the second switching element and the third switching element are connected to each other at a first node; the first node is connected with a ground and a first input terminal; a conduction control terminal of the third switching element is connected with the power supply terminal and the first terminal of the first switching element; a second terminal of the first switching element is connected with the first node; the second input terminal is connected with conduction control terminals of the first switching element and the second switching element; a first output terminal is connected with a second node; a second output terminal is connected with a third node; a first high-frequency cutoff element is connected with the power supply terminal and the second node; and a second high-frequency cutoff element is connected with the power supply terminal and the third node.

10 Claims, 7 Drawing Sheets

SIGNAL GENERATING CIRCUIT

BACKGROUND

1. Technical Field

The present disclosure relates to signal generating circuits that generate predetermined output signals.

2. Description of the Related Art

International Publication No. 2013/065254 discloses a circuit that includes a modulation unit that generates a modulation signal by modulating an oscillation signal with a control signal.

SUMMARY

In conventional techniques, it is desired that output signals of two systems be switched by varying a single input signal.

In one general aspect, the techniques disclosed here feature a signal generating circuit that includes a first input terminal to which a first input signal is input, a second input terminal to which a second input signal is input, a power supply terminal, a first switching element, a second switching element, a third switching element, a first high-frequency cutoff element, a second high-frequency cutoff element, a first output terminal from which a first output signal is output, and a second output terminal from which a second output signal is output. The power supply terminal is connected with a first terminal of the first switching element, a first terminal of the second switching element, and a first terminal of the third switching element. A second terminal of the second switching element and a second terminal of the third switching element are connected to each other at a first node. The first node is connected with a ground. A conduction control terminal of the third switching element is connected with a path that connects the power supply terminal with the first terminal of the first switching element. A second terminal of the first switching element is connected with the first node. The first input terminal is connected with the first node. The second input terminal is connected with a conduction control terminal of the first switching element and a conduction control terminal of the second switching element. The first output terminal is connected with a second node on a path that connects the power supply terminal with the first terminal of the second switching element. The second output terminal is connected with a third node on a path that connects the power supply terminal with the first terminal of the third switching element. The first high-frequency cutoff element is provided on a path that connects the power supply terminal with the second node. The second high-frequency cutoff element is provided on a path that connects the power supply terminal with the third node.

According to the present disclosure, output signals of two systems can be switched by varying a single input signal.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Hereinafter, embodiments of the present disclosure will be described with reference to the drawings.

Embodiments described hereinafter merely illustrate general or specific examples. The numerical values, the shapes, the materials, the constituent elements, the arrangement and positions of the constituent elements, the connection modes of the constituent elements, the steps, the order of the steps, and so forth indicated in the embodiments described hereinafter are examples and are not intended to limit the present disclosure. Among the constituent elements described in the embodiments hereinafter, constituent elements that are not described in an independent claim indicating the broadest concept are described as optional constituent elements.

First Embodiment

Figure 1:
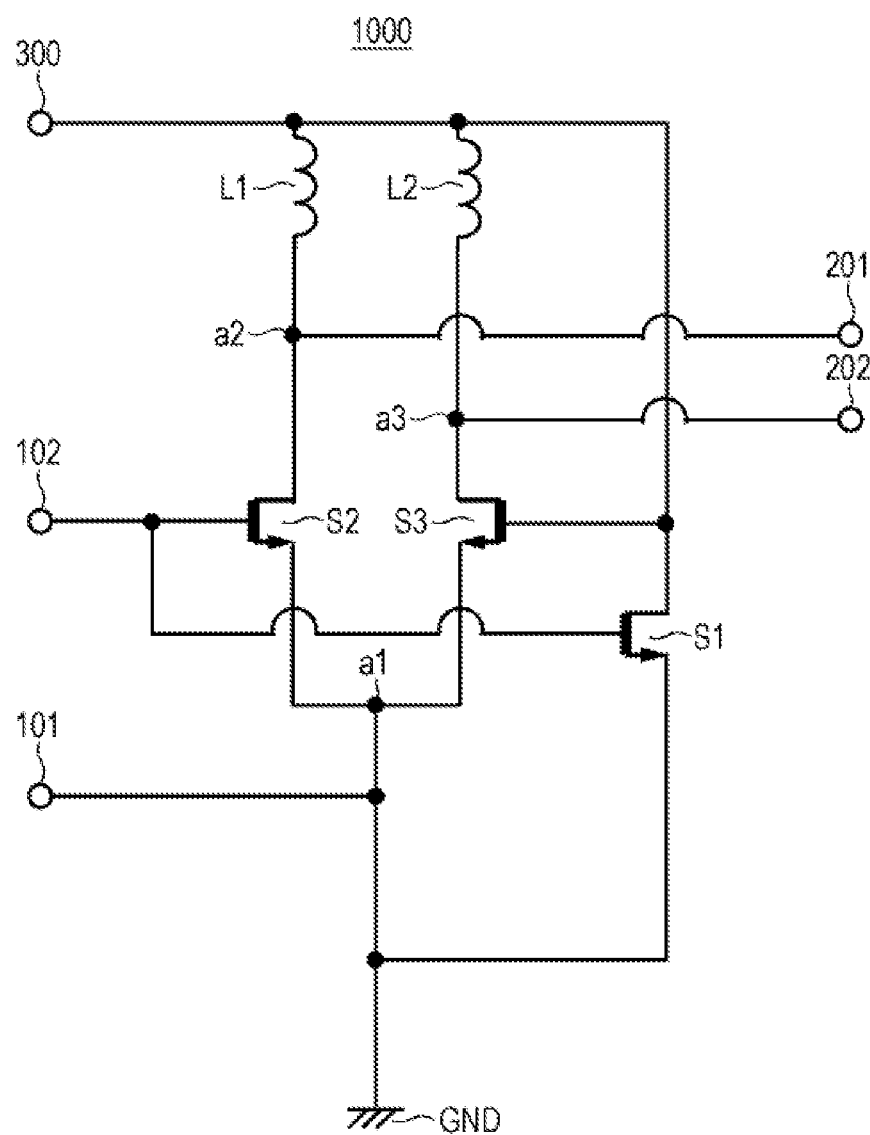
FIG. 1 is a circuit diagram illustrating a schematic configuration of a signal generating circuit according to a first embodiment.

FIG. 1 is a circuit diagram illustrating a schematic configuration of a signal generating circuit 1000 (e.g., signal generation circuit) according to a first embodiment.

The signal generating circuit 1000 according to the first embodiment includes a first input terminal 101, a second input terminal 102, a power supply terminal 300, a first switching element S1, a second switching element S2, a third switching element S3, a first high-frequency cutoff element L1, a second high-frequency cutoff element L2, a first output terminal 201, and a second output terminal 202.

The first input terminal 101 is a terminal to which a first input signal is input.

The second input terminal 102 is a terminal to which a second input signal is input.

The first output terminal 201 is a terminal from which a first output signal is output.

The second output terminal 202 is a terminal from which a second output signal is output.

The power supply terminal 300 is connected with a first terminal (e.g., drain terminal) of the first switching element S1, a first terminal (e.g., drain terminal) of the second switching element S2, and a first terminal (e.g., drain terminal) of the third switching element S3.

A second terminal (e.g., source terminal) of the second switching element S2 and a second terminal (e.g., source terminal) of the third switching element S3 are connected to each other at a first node a1.

The first node a1 is connected with a ground (GND).

A conduction control terminal (e.g., gate terminal) of the third switching element S3 is connected with a path that connects the power supply terminal 300 with the first terminal of the first switching element S1.

A second terminal (e.g., source terminal) of the first switching element S1 is connected with the first node a1 (e.g., first connection point).

The first input terminal 101 is connected with the first node a1.

The second input terminal 102 is connected with a conduction control terminal (e.g., gate terminal) of the first switching element S1 and a conduction control terminal (e.g., gate terminal) of the second switching element S2.

The first output terminal 201 is connected with a second node a2 (e.g., second connection point) on a path that connects the power supply terminal 300 with the first terminal of the second switching element S2.

The second output terminal 202 is connected with a third node a3 (e.g., third connection point) on a path that connects the power supply terminal 300 with the first terminal of the third switching element S3.

The first high-frequency cutoff element L1 is provided on a path that connects the power supply terminal 300 with the second node a2.

The second high-frequency cutoff element L2 is provided on a path that connects the power supply terminal 300 with the third node a3.

According to the configuration described above, output signals (the first output signal and the second output signal) of two systems can be generated by varying a single input signal (the second input signal). For example, when a high-frequency signal is used as the first input signal, output high-frequency signals of two systems can be generated in accordance with a change in the second input signal. For example, a signal that is in an inverse relation to the first output signal can be generated as the second output signal.

In addition, according to the configuration described above, a signal generating circuit (e.g., a mixing circuit having a signal inverting function) can be implemented by using, as a switching element, only a normally-on transistor (depletion transistor) without using a normally-off transistor. Thus, for example, the signal generating circuit can be constituted by using an N-type, normally-on field-effect transistor of nitride semiconductor. Accordingly, a power transmission apparatus that utilizes high-frequency power and the signal generating circuit can be integrated with ease. Furthermore, as compared with a case in which, for example, silicon semiconductor is used, a power transmission apparatus or the like with a higher-power, high-frequency output can be implemented. In addition, power consumption for generating signals can be reduced.

The power supply terminal 300 is connected, for example, with a voltage source. For example, a direct-current voltage of a predetermined voltage value is input to the power supply terminal 300.

The first high-frequency cutoff element L1 is a bias circuit that supplies a power supply voltage from the power supply terminal 300 to the second switching element S2 while cutting off a high-frequency wave.

The second high-frequency cutoff element L2 is a bias circuit that supplies a power supply voltage from the power supply terminal 300 to the third switching element S3 while cutting off a high-frequency wave.

The first high-frequency cutoff element L1 or the second high-frequency cutoff element L2 may be constituted, for example, by an inductor. Alternatively, the first high-frequency cutoff element L1 or the second high-frequency cutoff element L2 may be of another type of bias circuit (e.g., wiring that cuts off a high-frequency wave).

The signal generating circuit 1000 according to the first embodiment can switch between the output signals in accordance with which one of the second switching element S2 and the third switching element S3 operates.

Figure 2:
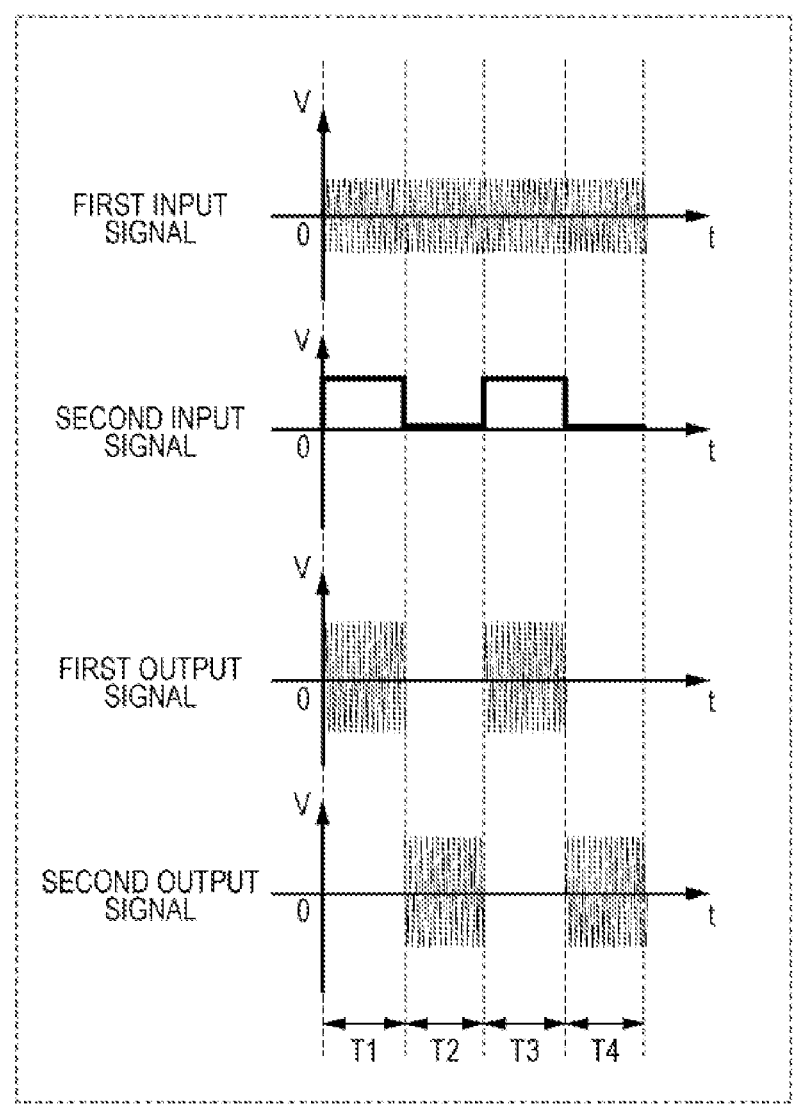
FIG. 2 illustrates examples of a first input signal, a second input signal, a first output signal, and a second output signal.

FIG. 2 illustrates examples of the first input signal, the second input signal, the first output signal, and the second output signal.

As illustrated in FIG. 2, in the first embodiment, the first input signal may be a high-frequency signal.

In addition, as illustrated in FIG. 2, in the first embodiment, the second input signal may be a signal that includes a first signal and a second signal.

The first signal has a first voltage value (e.g., period T1 or period T3 in FIG. 2).

The second signal has a second voltage value (e.g., period T2 or period T4 in FIG. 2).

In this case, the first voltage value is greater than the second voltage value.

According to the configuration described above, output high-frequency signals of two systems, for example, can be generated by varying a single input signal (the second input signal). For example, as illustrated in FIG. 2, a high-frequency signal that is in an inverse relation to the first output signal can be generated as the second output signal.

The frequency of a high-frequency wave that is input as the first input signal may, for example, be higher than the frequency of the second input signal. The frequency of a high-frequency wave that is input as the first input signal may be approximately 100 MHz or higher. The high-frequency wave that is input as the first input signal may be of a constant frequency and of a constant amplitude. Alternatively, the high-frequency wave that is input as the first input signal may be frequency-modulated or amplitude-modulated. The first input signal may be generated and output by a high-frequency oscillation unit. Specifically, the high-frequency oscillation unit may be a Colpitts oscillator, a Hartley oscillator, or an oscillator that generates a microwave. The signal generating circuit 1000 according to the first embodiment may include such a high-frequency oscillation unit.

The second input signal may be a binary pulse-wave signal. Alternatively, the second input signal may have another waveform (e.g., sinusoidal wave or the like). As another alternative, the second input signal may be a signal other than a binary signal. As yet another alternative, the second input signal may be a phase-modulated signal. The second input signal may be generated and output by a control unit. The control unit, for example, may be constituted by a processor (e.g., central processing unit (CPU), microprocessing unit (MPU), or the like). The control unit may further include a memory. The control unit may generate and output the second input signal as the processor reads out a program stored in the memory and executes the program. The signal generating circuit 1000 according to the first embodiment may include such a control unit.

In the signal generating circuit 1000 according to the first embodiment, the first switching element S1, the second switching element S2, and the third switching element S3 may each be a transistor.

For example, the first switching element S1, the second switching element S2, and the third switching element S3 may each be a normally-on transistor.

According to the configuration described above, the signal generating circuit of the first embodiment can be implemented by using only a positive power supply voltage without using a power supply of a negative voltage. Accordingly, the signal generating circuit of the first embodiment can, for example, be embedded in an integrated circuit with ease.

For example, the first switching element, the second switching element, and the third switching element may each be a normally-on, N-type field-effect transistor of nitride semiconductor.

This configuration provides excellent high-frequency characteristics. In addition, this configuration enables a high output to be achieved.

In the signal generating circuit 1000 according to the first embodiment, four or more switching elements (transistors) may be used.

In the signal generating circuit 1000 according to the first embodiment, three or more output terminals may be provided.

In the signal generating circuit 1000 according to the first embodiment, a resistance element may be disposed between the second input terminal and the conduction control terminal of the second switching element S2.

In the signal generating circuit 1000 according to the first embodiment, a resistance element may be disposed between the second input terminal and the conduction control terminal of the third switching element S3.

With the use of the signal generating circuit 1000 according to the first embodiment, for example, a high-frequency mixer that superimposes a signal on a high-frequency carrier wave (or modulates the amplitude thereof) can be constituted.

The signal generating circuit 1000 according to the first embodiment can be applied to another mixing circuit (e.g., Gilbert cell mixer or the like).

The signal generating circuit 1000 according to the first embodiment can also be applied to a circuit different from a mixing circuit (e.g., amplification circuit for switching the output or switching the intensity).

Second Embodiment

Hereinafter, as a specific configuration example of the first embodiment, a second embodiment will be described. Descriptions that are duplicate of those of the above-described first embodiment are omitted as appropriate.

Figure 3:
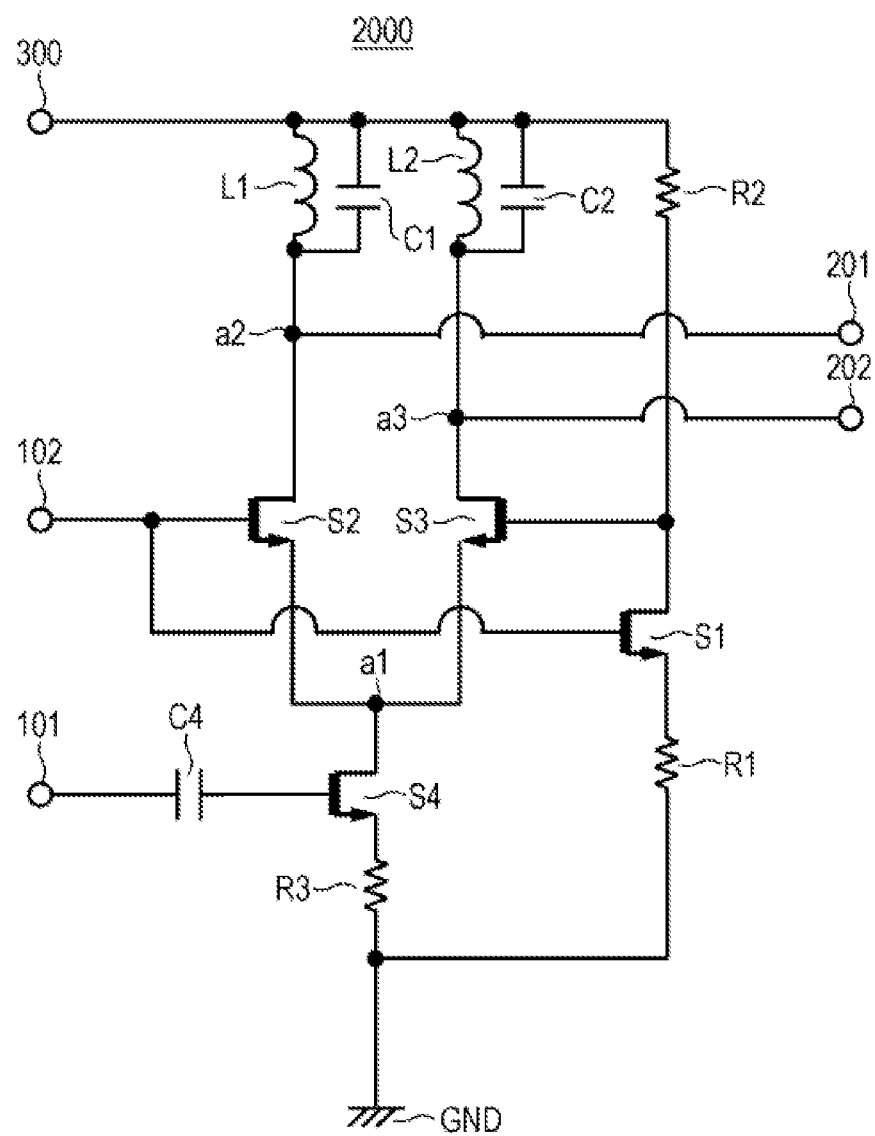
FIG. 3 is a circuit diagram illustrating a schematic configuration of a signal generating circuit according to a second embodiment.

FIG. 3 is a circuit diagram illustrating a schematic configuration of a signal generating circuit 2000 according to the second embodiment.

The signal generating circuit 2000 according to the second embodiment includes the components of the signal generating circuit 1000 according to the first embodiment described above. In addition to these components, the signal generating circuit 2000 according to the second embodiment includes the following components.

Specifically, the signal generating circuit 2000 according to the second embodiment includes a first resistance element R1.

The first resistance element R1 is provided on a path that connects the second terminal of the first switching element S1 with the first node a1.

According to the configuration described above, the magnitude of the voltage applied to the conduction control terminal of the third switching element S3 can be adjusted with high accuracy by adjusting the resistance value of the first resistance element R1.

The signal generating circuit 2000 according to the second embodiment further includes a second resistance element R2.

The second resistance element R2 is provided on a path that connects the power supply terminal 300 with the first terminal of the first switching element S1.

According to the configuration described above, the magnitude of the voltage applied to the conduction control terminal of the third switching element S3 can be adjusted with high accuracy by adjusting the resistance value of the second resistance element R2.

In this case, the resistance value of the first resistance element R1 may be greater than the resistance value of the second resistance element R2.

According to the configuration described above, the change in the voltage applied to the conduction control terminal of the third switching element S3 corresponding to the change in the voltage applied to the conduction control terminal of the first switching element S1 can be increased.

The signal generating circuit 2000 according to the second embodiment further includes a third resistance element R3.

The third resistance element R3 is provided on a path that connects the first node a1 with the ground.

According to the configuration described above, the magnitude of the voltage at the first node a1 (i.e., the reference voltage for the second switching element S2 and the third switching element S3) can be adjusted with high accuracy by adjusting the resistance value of the third resistance element R3.

The signal generating circuit 2000 according to the second embodiment further includes a fourth switching element S4.

A first end (e.g., drain terminal) of the fourth switching element S4 is connected with the first node a1.

A second end (e.g., source terminal) of the fourth switching element S4 is connected with the ground.

A conduction control terminal (e.g., gate terminal) of the fourth switching element S4 is connected with the first input terminal 101.

According to the configuration described above, a high-frequency signal input to the first input terminal 101 can be amplified.

The fourth switching element S4 may be a transistor. For example, the fourth switching element S4 may be a normally-on transistor. For example, the fourth switching element S4 may be a normally-on, N-type field-effect transistor of nitride semiconductor. This configuration provides excellent high-frequency characteristics. In addition, this configuration enables a high output to be achieved.

The signal generating circuit 2000 according to the second embodiment may further include a fourth capacitor C4.

The fourth capacitor C4 is provided between the first input terminal 101 and the conduction control terminal of the fourth switching element S4.

The signal generating circuit 2000 according to the second embodiment further includes a first capacitor C1 and a second capacitor C2.

In this case, the first high-frequency cutoff element L1 serves as a first inductor.

The second high-frequency cutoff element L2 serves as a second inductor.

In this case, the first capacitor C1 is connected in parallel with the first inductor.

The second capacitor C2 is connected in parallel with the second inductor.

According to the configuration described above, the configuration for cutting off a high-frequency wave can be further reduced in size.

As a specific example of the above-described signal generating circuit 2000, an example of the operation of the signal generating circuit will be described hereinafter.

In the exemplary operation described below, the power supply voltage applied to the power supply terminal 300 is 12 V.

In the exemplary operation described below, the threshold voltage of the gate of each of the first switching element S1, the second switching element S2, the third switching element S3, and the fourth switching element S4 is −2.5 V.

The resistance value of the first resistance element R1 is 1.5 kΩ.

The resistance value of the second resistance element R2 is 300Ω.

The resistance value of the third resistance element R3 is 100Ω.

As the third resistance element R3, for example, a resistance element having a resistance value of 30Ω to 150Ω may be used.

In the exemplary operation described below, the first input signal and the second input signal are the signals illustrated in FIG. 2.

The first input signal is a high-frequency wave having a frequency of 2.4 GHz.

The second input signal is a signal that includes a first signal (on signal) having a first voltage value of 5 V and a second signal (off signal) having a second voltage value of 0 V. In this case, the second input signal is 300 MBPS.

Hereinafter, an exemplary operation in each of the period T1 and the period T2 illustrated in FIG. 2 will be described.

Period T1

Figure 4:
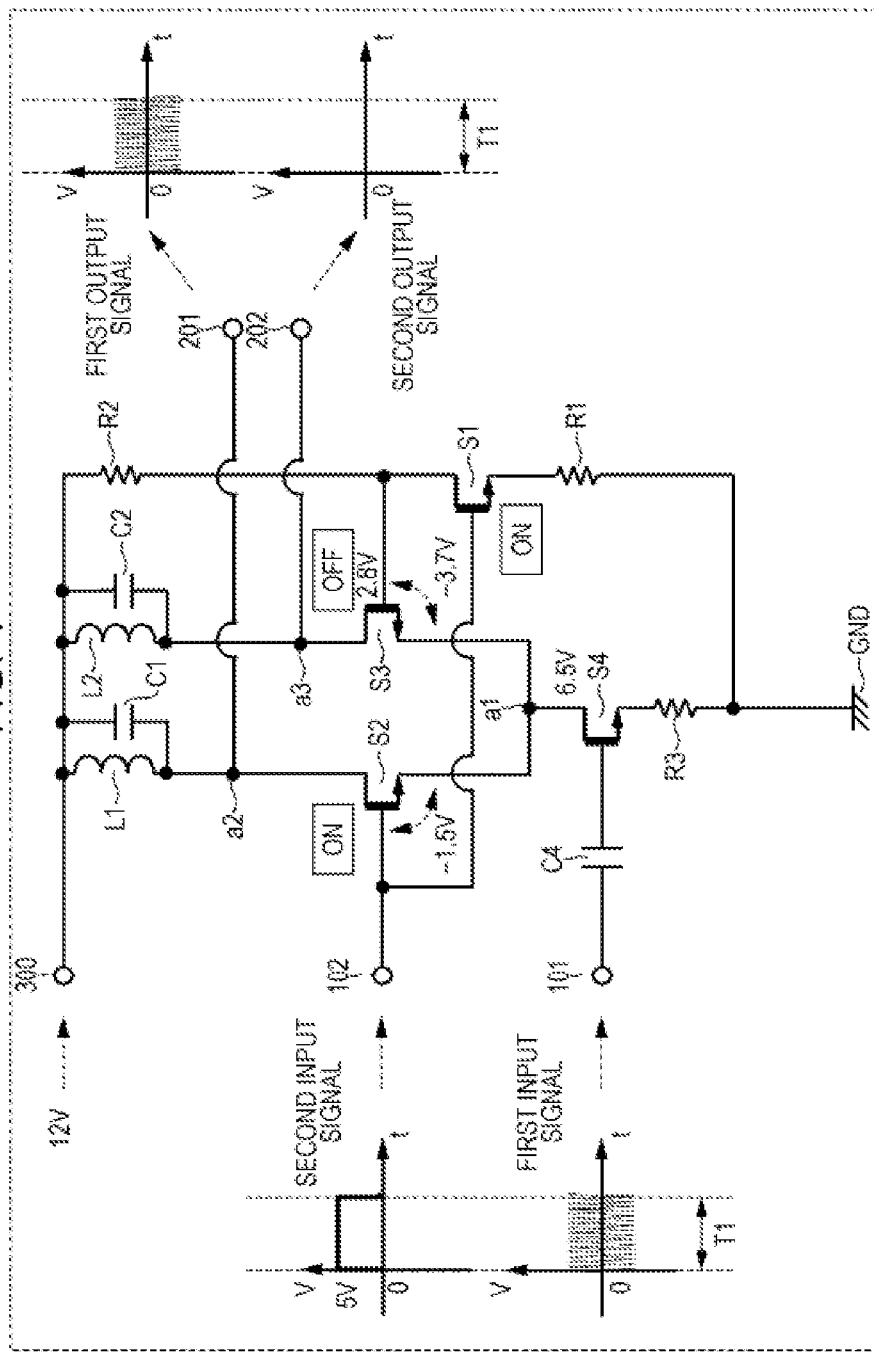
FIG. 4 illustrates an exemplary operation in a period T1 illustrated in FIG. 2.

FIG. 4 illustrates an exemplary operation in the period T1 illustrated in FIG. 2.

A voltage of 5 V is applied to the second input terminal 102.

This brings the gate voltage of the second switching element S2 to 5 V.

The drain voltage (reference voltage) of the fourth switching element S4 is set to be 6.5 V.

Therefore, the gate-source voltage of the second switching element S2 is −1.5 V.

Thus, the second switching element S2 enters an on state.

In other words, as the second switching element S2 enters an on state, a current flows from the power supply terminal 300, and the drain voltage (reference voltage) of the fourth switching element S4 becomes 6.5 V.

Since the second switching element S2 is in the on state, a high-frequency wave input from the first input terminal 101 is output from the first output terminal 201 via the second switching element S2.

Here, a voltage of 5 V is applied to the gate of the first switching element S1 as well.

Thus, the first switching element S1 enters an on state.

Through this, a large current flows through the first resistance element R1.

This causes the drain voltage of the first switching element S1 to drop greatly.

Thus, the drain voltage of the first switching element S1 (i.e., the gate voltage of the third switching element S3) becomes 2.8 V.

At this point, the gate-source voltage of the third switching element S3 becomes −3.7 V.

Thus, the third switching element S3 enters an off state.

Since the third switching element S3 is in the off state, a high-frequency wave input from the first input terminal 101 is not output from the second output terminal 202.

As described above, either of the second switching element S2 and the third switching element S3 that has a higher gate voltage enters an on state. The reference voltage is generated in the other one of the two, which thus enters an off state.

Period T2

Figure 5:
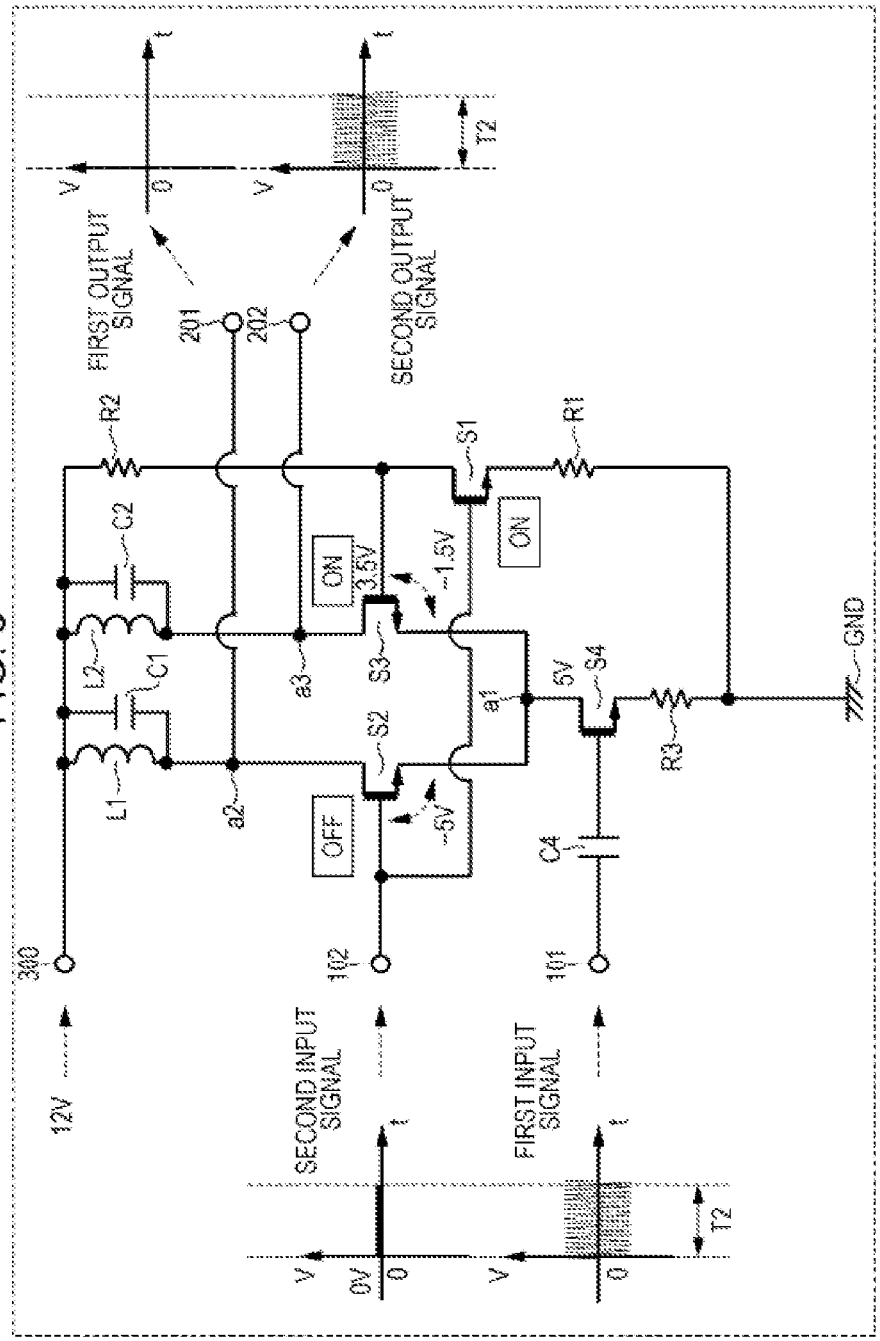
FIG. 5 illustrates an exemplary operation in a period T2 illustrated in FIG. 2.

FIG. 5 illustrates an exemplary operation in the period T2 illustrated in FIG. 2.

A voltage of 0 V is applied to the second input terminal 102.

This brings the gate voltage of the second switching element S2 to 0 V.

The gate voltage of the first switching element S1 also becomes 0 V.

Thus, a current that flows through the first switching element S1 is smaller than the current that flows in the period T1 described above.

Therefore, the drain voltage of the first switching element S1 does not fall very much.

Thus, the drain voltage of the first switching element S1 becomes high (3.5 V).

This brings the gate voltage of the third switching element S3 to 3.5 V as well.

Meanwhile, the gate voltage of the second switching element S2 is 0 V.

Accordingly, the third switching element S3 enters an on state.

Thus, a current flows from the power supply terminal 300 via the third switching element S3, which brings the drain voltage (reference voltage) of the fourth switching element S4 to 5 V.

At this point, the gate-source voltage of the third switching element S3 is −1.5 V.

Accordingly, the third switching element S3 enters an on state.

Since the third switching element S3 is in the on state, a high-frequency wave input from the first input terminal 101 is output from the second output terminal 202 via the third switching element S3.

Meanwhile, the gate-source voltage of the second switching element S2 is −5 V.

Accordingly, the second switching element S2 enters an off state.

Since the second switching element S2 is in the off state, a high-frequency wave input from the first input terminal 101 is not output from the first output terminal 201.

Figure 6:
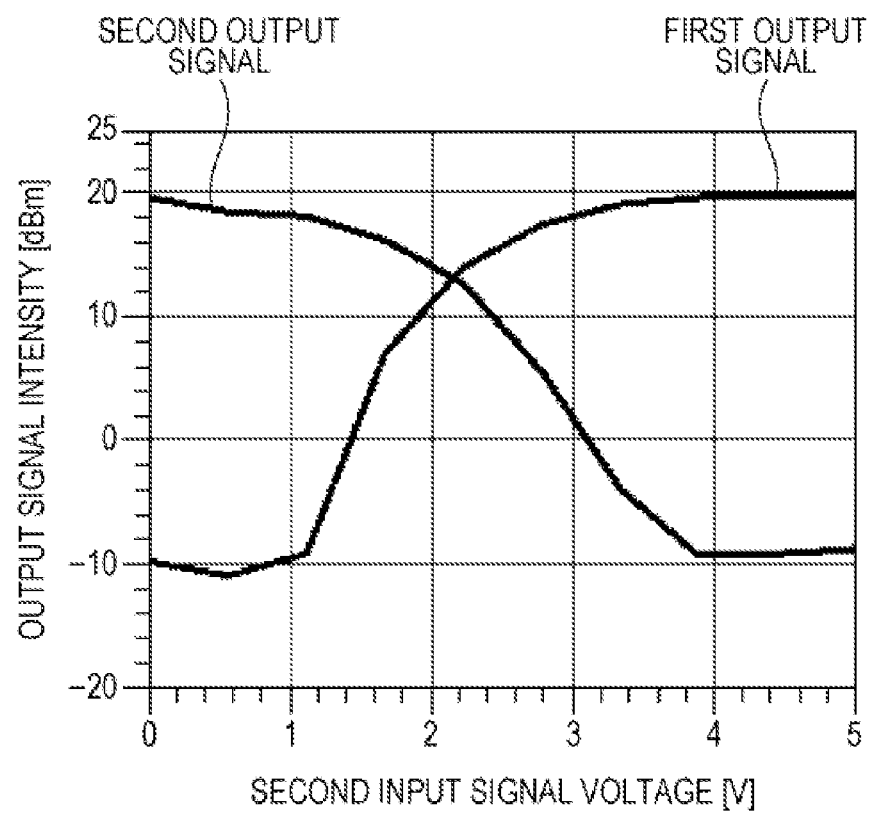
FIG. 6 illustrates a result of measuring an output intensity of the signal generating circuit according to the second embodiment.

FIG. 6 illustrates a result of measuring the output intensity of the signal generating circuit 2000 according to the second embodiment.

The output intensity obtained when a high-frequency wave of 2.4 GHz is input from the first input terminal 101 and the voltage of the second input signal input to the second input terminal 102 is varied is measured.

First, as illustrated in FIG. 6, when the voltage of the second input signal is 0 V, a high-frequency wave is output from the second output terminal 202. Meanwhile, no high-frequency wave is output from the first output terminal 201.

In addition, as illustrated in FIG. 6, when the voltage of the second input signal is 5 V, a high-frequency wave is output from the first output terminal 201. Meanwhile, no high-frequency wave is output from the second output terminal 202.

As described above, according to the signal generating circuit of the present disclosure, the output terminals can be switched therebetween only by varying the voltage of the second input signal.

With the signal generating circuit of the present disclosure, a mixing circuit that switches between high-frequency outputs only by varying a single input signal can be implemented.

Furthermore, with the signal generating circuit of the present disclosure, a high-frequency mixing circuit provided with an inverting function can be constituted only by N-type transistors.

Accordingly, the signal generating circuit of the present disclosure can render a negative power supply unnecessary. In other words, the signal generating circuit can operate only with a single power supply voltage.

Furthermore, with the signal generating circuit of the present disclosure, the power consumed by the inverting function is determined on the basis of the current that flows through the first resistance element R1 and the second resistance element R2 and the voltage applied to the first resistance element R1 and the second resistance element R2. Accordingly, the power consumed by the inverting function can be reduced.

Third Embodiment

Hereinafter, as another specific configuration example of the first embodiment, a third embodiment will be described. Descriptions that are duplicate of those of the above-described first embodiment or second embodiment are omitted as appropriate.

Figure 7:
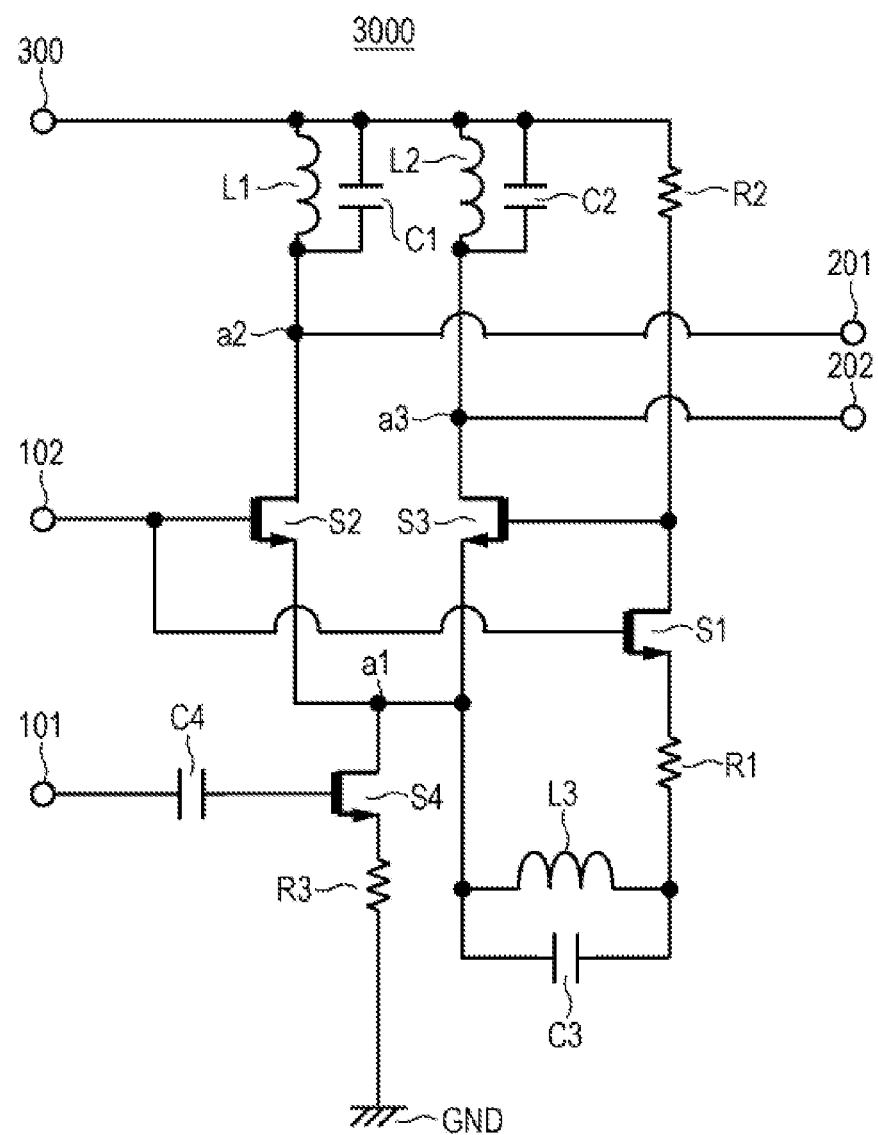
FIG. 7 is a circuit diagram illustrating a schematic configuration of a signal generating circuit according to a third embodiment.

FIG. 7 is a circuit diagram illustrating a schematic configuration of a signal generating circuit 3000 according to the third embodiment.

The signal generating circuit 3000 according to the third embodiment includes the components of the signal generating circuit 1000 according to the first embodiment described above. In addition to these components, the signal generating circuit 3000 according to the third embodiment includes the following components.

Specifically, the signal generating circuit 3000 according to the third embodiment includes a third inductor L3.

The third inductor L3 is provided on a path that connects the second terminal of the first switching element S1 with the first node a1.

According to the configuration described above, a high-frequency wave input from the first input terminal 101 can be prevented from reaching the first switching element S1.

The signal generating circuit 3000 according to the third embodiment may further include a third capacitor C3.

In this case, the third capacitor C3 is connected in parallel with the third inductor L3.

According to the configuration described above, the configuration for cutting off a high-frequency wave can be further reduced in size.

In the signal generating circuit according to the present disclosure, in place of the third inductor L3, another circuit that cuts off the first input signal may be used.

Some of the components illustrated in the second embodiment described above may selectively be used as components of the signal generating circuit of the third embodiment, as appropriate.

In the first to third embodiments described above, when two elements are connected (e.g., when one element is connected with another element), the two elements may be connected directly or electrically or may be connected with another element (e.g., a wire, a resistance element, etc. that do not compromise the functions of the embodiments) interposed therebetween.

The present disclosure can be applied, for example, to a transmission apparatus that contactlessly transmits a power signal, a transmission apparatus that transmits a high-frequency signal, or the like.

While the present disclosure has been described with respect to exemplary embodiments thereof, it will be apparent to those skilled in the art that the disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A signal generating circuit, comprising:
a first input terminal to which a first input signal is input;
a second input terminal to which a second input signal is input;
a power supply terminal;
a first switching element;
a second switching element;
a third switching element;
a first high-frequency cutoff element;
a second high-frequency cutoff element;
a first output terminal from which a first output signal is output; and
a second output terminal from which a second output signal is output,
wherein the power supply terminal is connected with a first terminal of the first switching element, a first terminal of the second switching element, and a first terminal of the third switching element,
wherein a second terminal of the second switching element and a second terminal of the third switching element are connected to each other at a first node, wherein
the first node is connected with a ground,
a conduction control terminal of the third switching element is connected with a path that connects the power supply terminal with the first terminal of the first switching element,
a second terminal of the first switching element is connected with the first node,
the first input terminal is connected with the first node,
the second input terminal is connected with a conduction control terminal of the first switching element and a conduction control terminal of the second switching element,
the first output terminal is connected with a second node on a path that connects the power supply terminal with the first terminal of the second switching element,
the second output terminal is connected with a third node on a path that connects the power supply terminal with the first terminal of the third switching element,
the first high-frequency cutoff element is provided on a path that connects the power supply terminal with the second node, and
the second high-frequency cutoff element is provided on a path that connects the power supply terminal with the third node.

2. The signal generating circuit according to claim 1, wherein
the first input signal is a high-frequency signal,
the second input signal includes a first signal having a first voltage value and a second signal having a second voltage value, and
the first voltage value is greater than the second voltage value.

3. The signal generating circuit according to claim 1, wherein the first switching element, the second switching element, and the third switching element are each a normally-on transistor.

4. The signal generating circuit according to claim 1, further comprising:
a first resistance element,
wherein the first resistance element is provided on a path that connects the second terminal of the first switching element with the first node.

5. The signal generating circuit according to claim 4, further comprising:
a second resistance element, wherein
the second resistance element is provided on a path that connects the power supply terminal with the first terminal of the first switching element, and
a resistance value of the first resistance element is greater than a resistance value of the second resistance element.

6. The signal generating circuit according to claim 1, further comprising:
a third resistance element,
wherein the third resistance element is provided on a path that connects the first node with the ground.

7. The signal generating circuit according to claim 1, further comprising:
a fourth switching element,
wherein a first end of the fourth switching element is connected with the first node,
a second end of the fourth switching element is connected with the ground, and
a conduction control terminal of the fourth switching element is connected with the first input terminal.

8. The signal generating circuit according to claim 1, further comprising:
a first capacitor; and
a second capacitor,
wherein the first high-frequency cutoff element is a first inductor,
the second high-frequency cutoff element is a second inductor,
the first capacitor is connected in parallel with the first inductor, and
the second capacitor is connected in parallel with the second inductor.

9. The signal generating circuit according to claim 1, further comprising:
a third inductor,
wherein the third inductor is provided on a path that connects the second terminal of the first switching element with the first node.

10. The signal generating circuit according to claim 9, further comprising:
a third capacitor,
wherein the third capacitor is connected in parallel with the third inductor.

* * * * *